(12) United States Patent
Roesner

(10) Patent No.: US 6,982,190 B2
(45) Date of Patent: Jan. 3, 2006

(54) CHIP ATTACHMENT IN AN RFID TAG

(75) Inventor: Bruce Roesner, San Diego, CA (US)

(73) Assignee: ID Solutions, Inc., Tapei (TW)

( * ) Notice: Subject to any disclaimer, the term of this patent is extended or adjusted under 35 U.S.C. 154(b) by 195 days.

(21) Appl. No.: 10/396,932

(22) Filed: Mar. 25, 2003

(65) Prior Publication Data

US 2004/0192011 A1 Sep. 30, 2004

(51) Int. Cl.
*H01L 21/44* (2006.01)
(52) U.S. Cl. ........................... 438/108; 438/106
(58) Field of Classification Search ............... 438/106, 438/108, 111–114, 460, 22–23, 25–26, 42, 438/118–119, 127, 666–668, 678, 700
See application file for complete search history.

(56) References Cited

U.S. PATENT DOCUMENTS

| | | | | |
|---|---|---|---|---|
| 3,722,072 A | * | 3/1973 | Beyerlein | 228/180.21 |
| 3,724,068 A | * | 4/1973 | Galli | 29/833 |
| 3,868,764 A | * | 3/1975 | Hartleroad et al. | 228/123.1 |
| 5,897,337 A | * | 4/1999 | Kata et al. | 438/114 |
| 6,093,971 A | * | 7/2000 | Oppermann et al. | 257/783 |

* cited by examiner

*Primary Examiner*—Michael Lebentritt
*Assistant Examiner*—Andre' Stevenson
(74) *Attorney, Agent, or Firm*—Fish & Richardson P.C.

(57) ABSTRACT

A design and method for attaching an RFID chip to a conductive pattern is disclosed. According to the invention, multiple die are aligned with respective multiple conductive modules for structural and electrical attachment. As disclosed, the multiple die can be attached near simultaneously and without the need for intermediate handling. Therefore, substantial cost benefits are realized. Also disclosed is a method of making electrical connections employing the use of a laser. A photosensitive adhesive material is used to structurally secure the attachment.

19 Claims, 6 Drawing Sheets

CHIP ATTACHMENT IN AN RFID TAG

BACKGROUND OF THE INVENTION

1. Field of The Invention

The invention relates generally to integrated circuit attachment to a substrate and more particularly to the electrical and structural attachment of a radio frequency identification RFID chip to a conductive module. More specifically, the invention pertains to a design and method for efficiently attaching RFID chips directly to respective conductive modules.

2. Description of the Prior Art

Radio frequency identification (RFID) systems are known and are useful for remote identification of physical objects. The identifier is also referred to as a "transponder" or "tag." In most applications, the RFID tag is in the form of an integrated circuit chip that in its barest form is a silicon die sawed from a silicon wafer.

Although RFID systems are proliferating at a rapid rate worldwide, the key to their future success lies in reducing the price of the tag. There are three major factors that drive the cost in manufacturing RFID tags. The first is the chip itself. The second is the final assembly of a module that typically includes testing. Both of these items are being addressed by the manufacturers in a satisfactory fashion. But the third area that drives cost and the one not being advanced is the ability to attach an RFID chip to a module inexpensively.

Presently, there are number of methods used in attaching a die to a substrate. The earliest method is a carryover from standard integrated circuit attachment used in packaging. Referring to prior art FIG. 1, a die 11 is attached onto a substrate 14 with its face up using either an epoxy or eutectic bonding that entails applying heat coupled with scrubbing action. Wire bonding 12 is then used to connect the chip's pads to the substrate's conductive pattern 13. Not only is this assembly method itself costly, but it requires a stiffer and more costly substrate.

A more typical method used by RFID manufacturers today is to place the chip face down against a patterned conductive material, the method commonly referred to as flip-chip bonding (FIG. 2). The bonding pads 22 of the chip 11 are aligned to the conductive pattern 13 to complete the final electrical connection. The ohmic contact formed between the chip and the conductor may take many forms and typically an intermediate conductive epoxy 21 is needed. Another method is to press the pad onto the conductive pattern and hold it in place with a non-conductive epoxy. Yet another alternative technique is to ultrasonically bond the die pads to the conductive pattern. From the various evolving techniques, slight cost advantages have been recognized through different implementations. However, the methods generally suffer from slow throughput and high cost since each die must be placed and attached individually which most often requires physical handing by a technician.

It should also be recognized that low frequency (<100 MHz) tags do not require a space between the conductive pattern and the die. This is not the case with high frequency (>400 MHz) tags where a space must be maintained in order to assure that the coupling between the two elements does not cause a detuning of the final assembled tag. Therefore, new methods must be able to efficiently attach low and high frequency tags.

In light of this problem, it is an object of the present invention to provide a die attachment design that allows for mechanical alignment and direct attachment of die to a conductive module, thereby eliminating the intermediate step of physically handling the die. It is yet another object of the present invention to provide a design that enables multiple die to be attached near simultaneously by aligning the multiple die to multiple conductive modules. Yet another object of the present invention is to provide a die attachment method that employs the use of laser light or ultrasonic bonding to make electrical connections between the die and the conductive module. Yet still another object of the present invention is to provide a die attachment method that employs the use a photosensitive hardening material to structurally secure the die to the conductive module. Finally, it is further an object of the invention to provide a design and method that reduces the cost die attachment.

BRIEF SUMMARY OF THE INVENTION

In a first aspect, the invention is a design for aligning a die to a conductive module that allows for direct attachment of the die to the conductive module, thereby eliminating the intermediate step of physically handling the die.

In a second aspect, the invention is a design for attaching a plurality of die to a plurality of conductive modules that comprises: a column of die having been sawed from a wafer wherein each die contains solder pads; a plurality of conductive modules wherein the plurality of conductive modules are aligned over the column of die so that each of the conductive modules can be sequentially attached to a respective die and; circuitry to electrically connect the conductive modules to their respective die using the solder pads. The circuitry is able to compensate for an offset in alignment between the conductive modules and the respective die.

The design further comprises an upper platform to support the conductive modules wherein the upper platform has sprocket holes to facilitate alignment of each conductive module to its respective die. The design also includes a lower platform to support the column of die that has a pin used to move a die from the lower platform to the upper platform. A photosensitive curable adhesive is provided in a preferred embodiment to structurally secure the conductive module to its respective die. The solderable pads are alternatively bumped to provide a space between each conductive module and its respective die for high frequency conductance.

The present invention is further a method of attaching multiple conductive modules to respective die wherein a plurality of die attachments can be performed near simultaneously. The method comprises the steps of: providing a column of die sawed from a wafer and having solderable pads; aligning the multiple conductive modules over the column of die; attaching the multiple conductive modules to respective die in succession. The method further comprises the steps of: removing attached multiple conductive modules to respective die; aligning a second set of multiple conductive modules over the column of die to a second set of respective die and attaching the second set of multiple conductive modules to the second set of respective die so that die are attached more efficiently than if aligned and attached one at a time.

The aligning step of the method is performed visually or mechanically using sprocket holes. The method further comprises the steps of: bonding electrical connections between the die and the conductive modules using a laser or ultrasonic bonder; and securing the die attachments structurally using a photosensitive hardening material and exposing said photosensitive material to UV light.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

The objects, advantages and features of the present invention will become more apparent to those skilled in the art from the following detailed description, when read in conjunction with the accompanying drawings, wherein.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The method of the present invention involves directly connecting multiple die in wafer form to a reel of substrates, which alternatively could be modules or antennas. The described method is not intended as the only means of implementing the inventive concepts disclosed herein.

Figure 1:
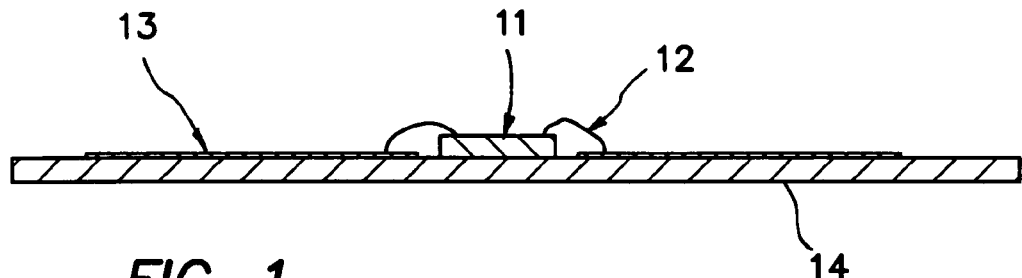
FIG. 1 is an illustration of a prior art die attachment that employs wire bonds for electrical connectivity.
Figure 2:
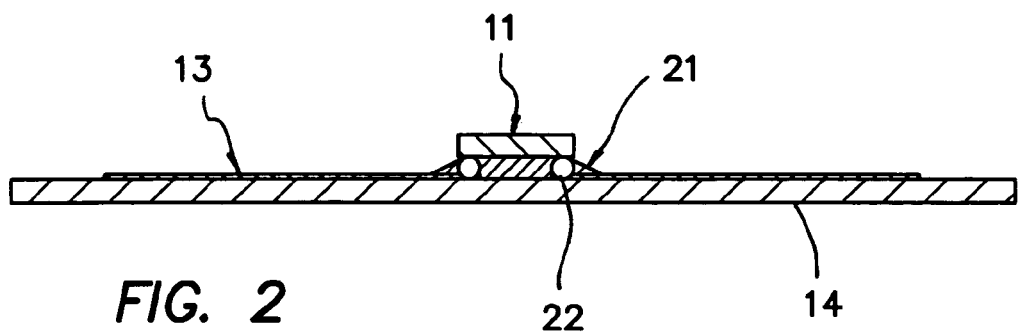
FIG. 2 is an illustration of prior art flip-chip die attachment.
Figure 3:
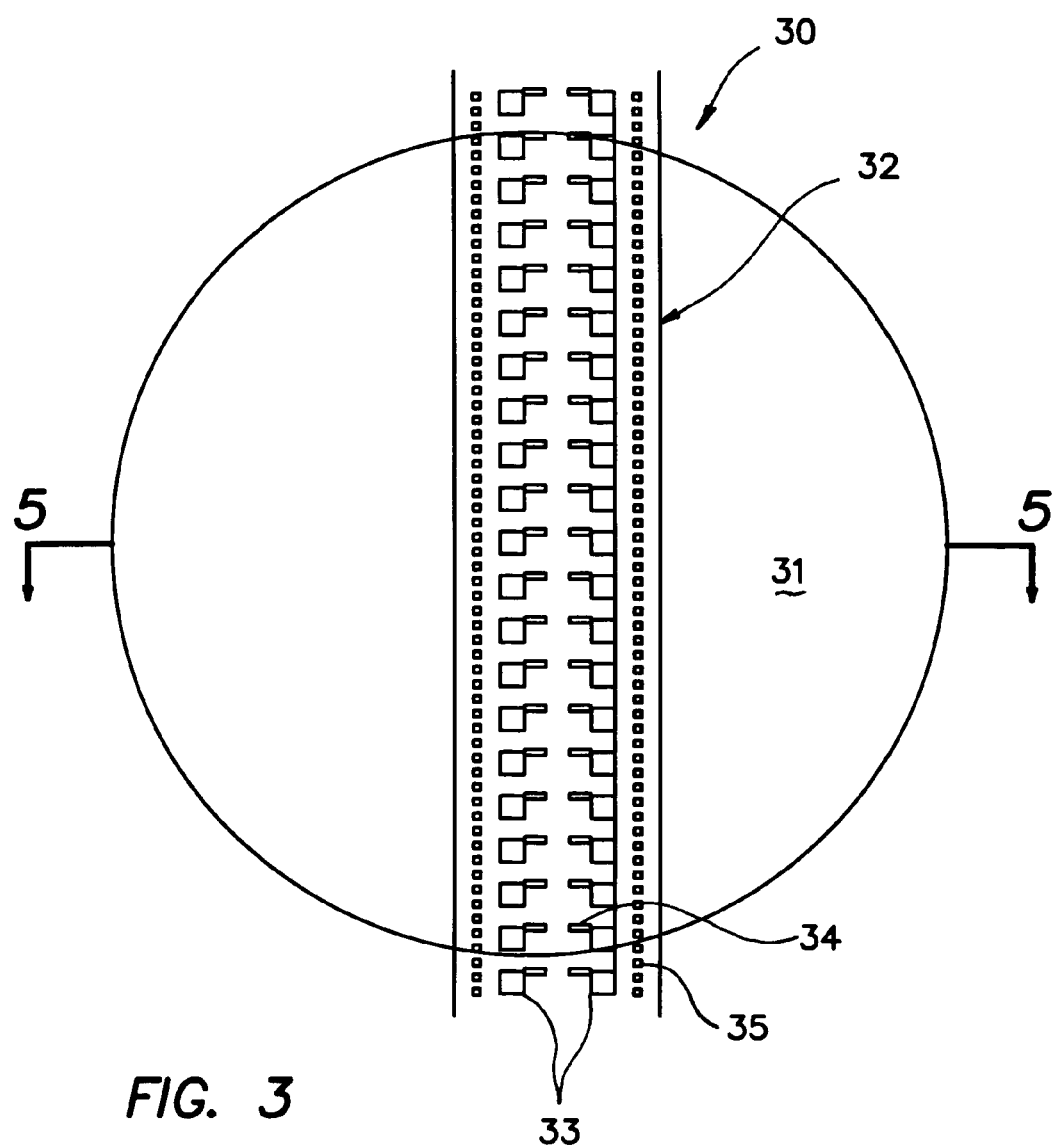
FIG. 3 is a top plane view of a reel of conductive modules aligned over a plurality of RFID chips in a sawed wafer format.
Figure 4:
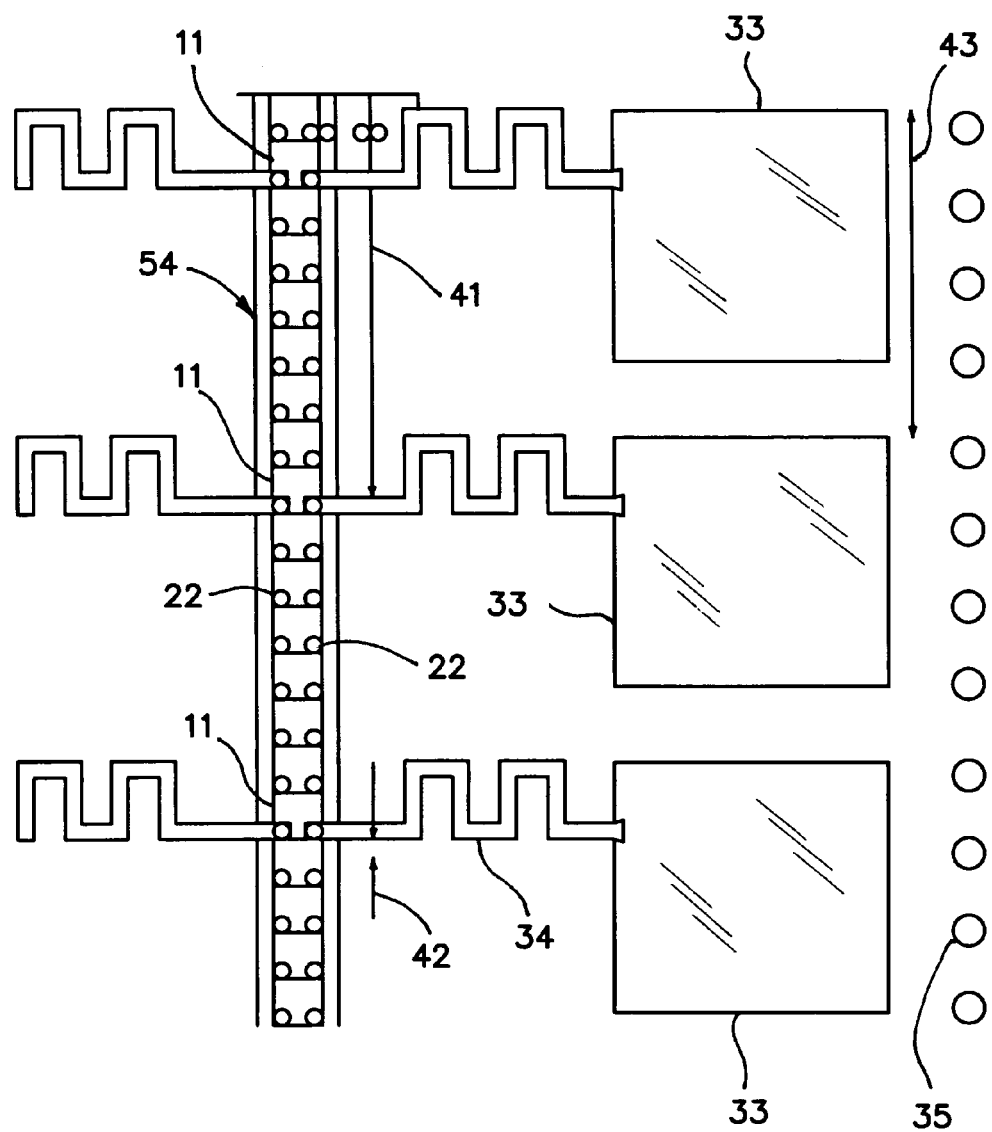
FIG. 4 is an enlarged view of the alignment of FIG. 3 further showing a column of die of the present invention that are attached to conductive modules.

Now referring to FIG. 3 a reel of conductive patterned modules 32 passes over the top of a wafer 31 in which the die (not shown) have been sawed and the pads bumped in the case of high frequency tags. FIG. 4 is a higher magnification of the alignment of the modules 33 to the die 11 that are in a column. It should be noted that a module 33 is made up of two symmetrical conductive members, one for each solder bump 22 of a die 11.

Still referring to FIG. 4, sprocket holes 35 have a known spacing between them and are provided to mechanically align the conductive modules 33 to respective die 11. Therefore, a quick and accurate alignment is provided without having to use an optical sensor. The sprocket holes 35 also display the pitch length 43 that is the distance between adjacent modules 33. The pitch length 41 of successive die 11 to be attached is equal to the die height times the incremental number of die between successive die 11 to be attached as shown in FIG. 4. The present invention is able to account for offset 42 between the pitch length 41 of successive die 11 and pitch length 43 between adjacent modules 33. For example, if the die height equals 1.1 millimeters, the number of die between successive die is fifteen, and the pitch length between adjacent modules 33 is sixteen millimeters, then the present invention could account for the five millimeter offset. The number of die 11 and modules 33 aligned at a given time can vary depending upon the capabilities of the equipment.

Figure 5A:
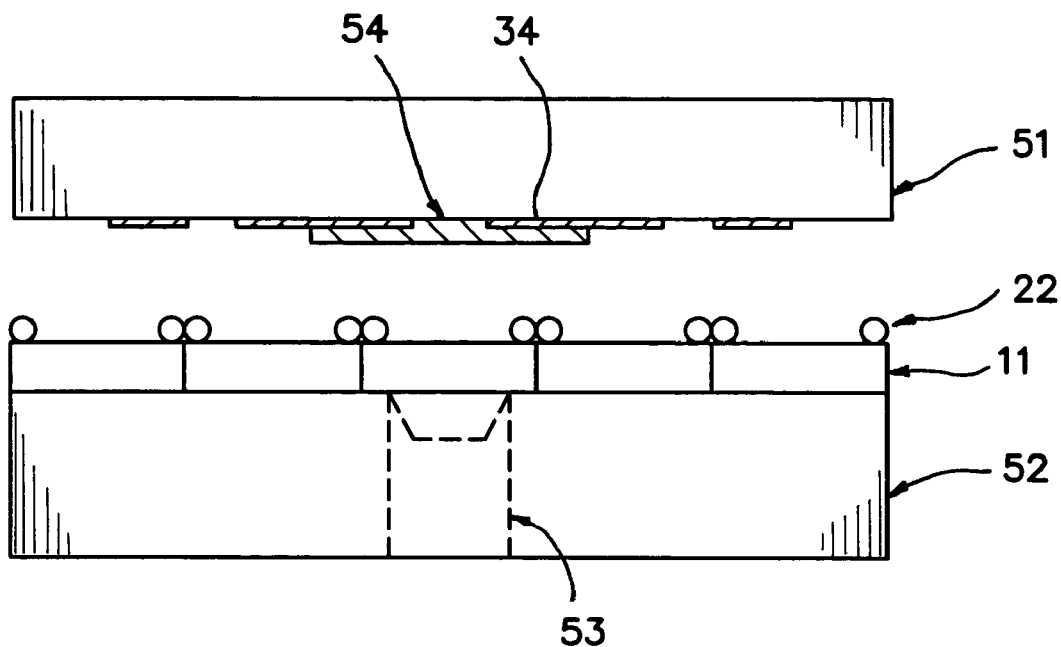
FIG. 5a is an enlarged cross sectional view of a conductive module aligned over a die and ready for attachment.
Figure 5B:
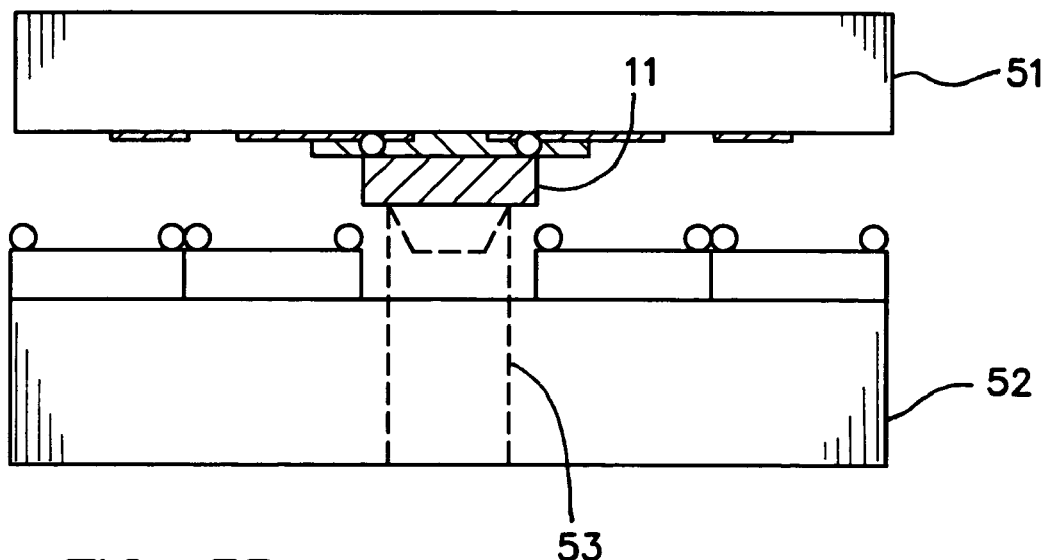
FIG. 5b is a sequential cross sectional view of an attachment of the present invention that shows a die forced upward with a pin to connect the conductive module.
Figure 5C:
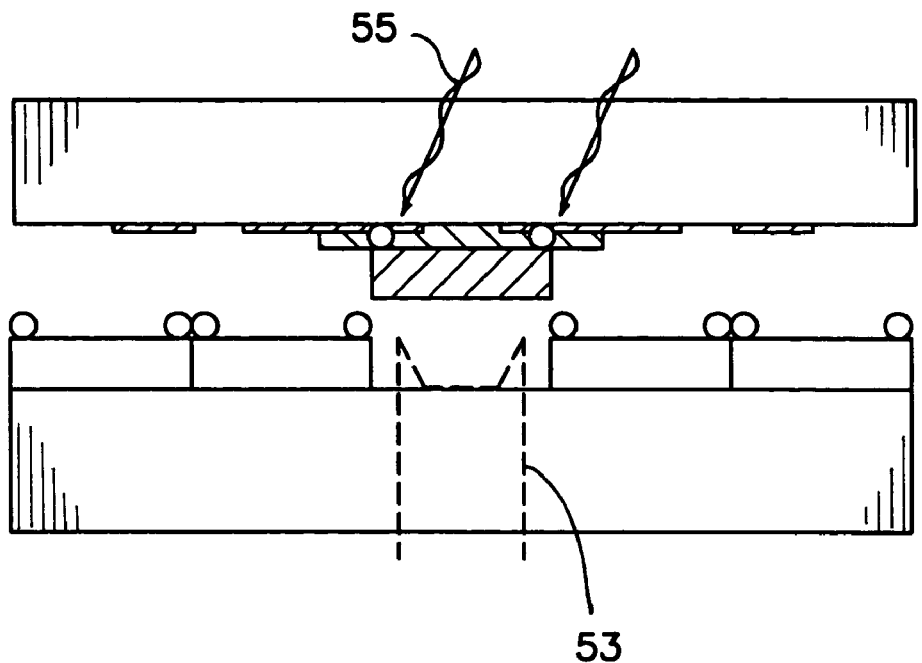
FIG. 5c is a sequential cross sectional view of an attachment of the present invention that shows the use of a laser to electrically connect a bond pad to a conductor.

Now referring to FIGS. 5a and 5b, once the modules 33 and die 11 are aligned, the die 11 are pushed upward with pin 53, penetrating through an adhesive 54, to contact the module conductive traces 34. Sufficient energy is applied to the bumps 22, or pad area, to cause the banding at the interface (FIG. 5c). This energy could take many different forms but a laser 55 is contemplated as a preferred means. Alternatively, it may be possible to forego the bonding in that there might be sufficient electrical conductivity without physical bonding. Upper and lower platforms 51, 52 support the conductive modules and the multiple die, respectively.

Figure 5D:
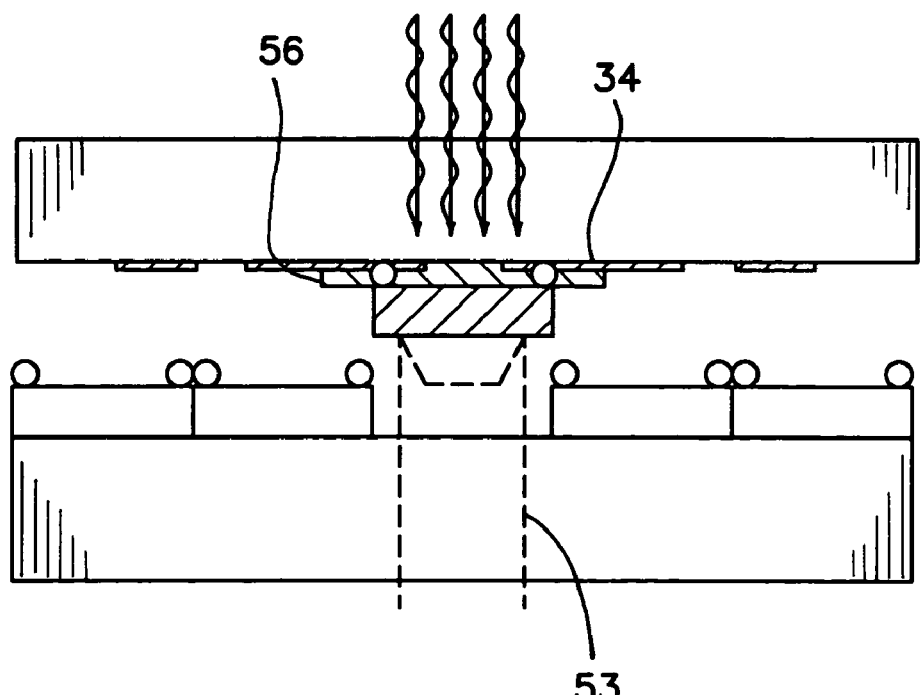
FIG. 5d shows another sequential cross sectional view of the present invention where UV light applied to a photosensitive material to structurally secure the attachment.
Figure 5E:
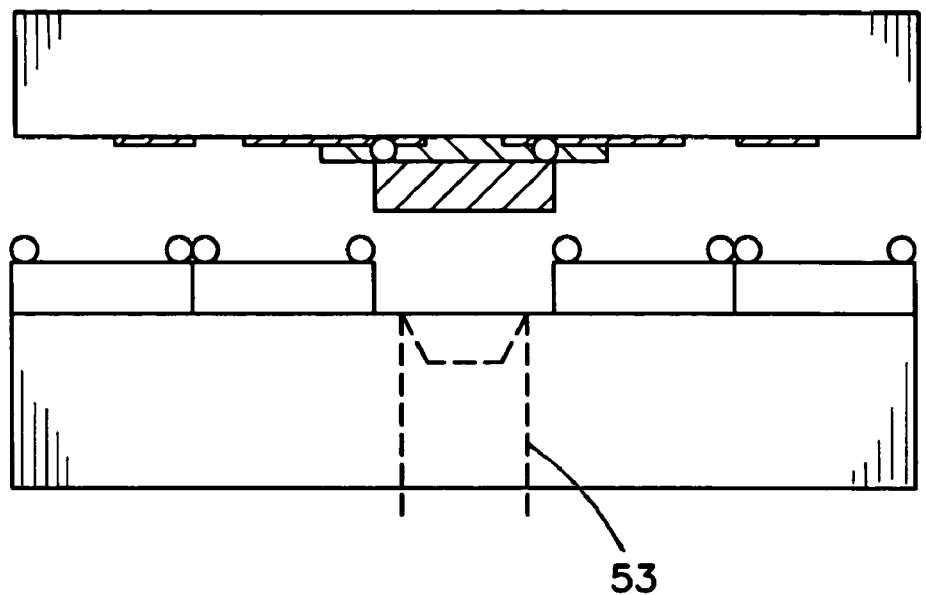
FIG. 5e shows another sequential cross sectional view of the present invention where the pin used to force the die to the conductive module is withdrawn.

In FIG. 5d a photosensitive adhesive 56 is cured to assure that the die is firmly connected to the module. As an example, a UV sensitive material 56 is a preferred adhesive means, however other adhesive means may be employed such as a non-conductive epoxy. The pin 53 keeps pressure on the back of die to hold it against the module circuit traces 34. Finally, the pin is removed (FIG. 5e) and the process is repeated for the other die 11 that were aligned. For example, FIG. 4 shows three die 11 being aligned at one time.

Figure 6:
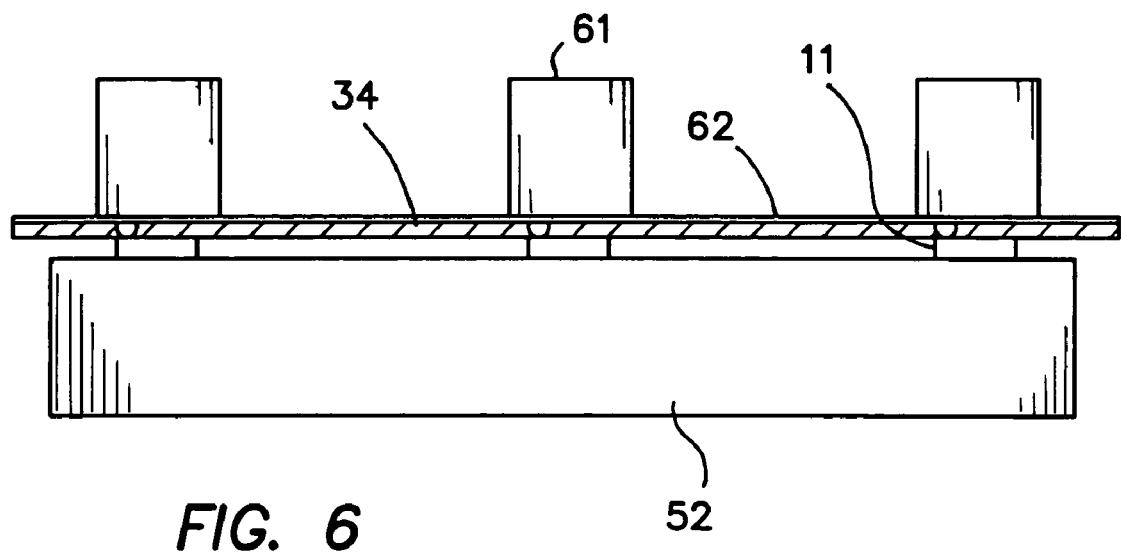
FIG. 6 illustrates an alternative embodiment to that shown in FIG. 5c in which ultrasonic bonding is employed instead of laser light or other means.

Now referring to FIG. 6, a sketch of ultrasonic bonding of multiple die is illustrated. Ultrasonic head 61 is employed for this purpose and adhesive 62 is chosen for optimum performance in ultrasonic bonding.

The present invention contains various unique aspects. Importantly, the present invention allows for direct attachment of the die to a substrate without having an intermediate handling of the die by a technician and without the use of expensive automated equipment. Also it allows the ability to attach multiple die to modules simultaneously. Additionally, the use of a laser or ultrasonic bonder to attach the die pads to the modules is unique as is the use of UV sensitive material to structurally attach the die to the module.

The prior art methods presently being used result in a module assembly cost of approximately 6–10 cents. The proposed method has been initially estimated to reduce that cost to 1–2 cents, when large quantities of attachments are required.

Many alterations and modifications of the present invention may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be is made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. A design for attaching a die directly to a conductive module comprising:
   a die supported by a lower platform;
   a conductive module having conductive traces;
   aligning means to align the conductive module over the die;
   removing means to remove the die from the lower platform to connect to the conductive traces; and
   attaching means to electrically and structurally attach the die to the conductive traces;
   wherein the attaching means comprises an adhesive on the conductive module and one or more humps on the die that penetrate through the adhesive, during attachment of the die to the conductive module, to contact the conductive traces.

2. The design of claim 1, wherein the aligning means comprises sprocket holes.

3. The design of claim 1, wherein the removing means comprises a pin.

4. A design for attaching a plurality of die to a plurality of conductive modules comprising:
   a column of die having been sawed from a wafer wherein each die contains one or more solder pads;
   a plurality of conductive modules wherein said plurality of conductive modules are aligned over said column of die so that each of said plurality of conductive modules can be attached to a respective die; and
   circuitry to electrically connect said each of said plurality of conductive modules to said respective die using said one or more solder pads,
   wherein the circuitry is able to compensate for an offset in alignment between said plurality of conductive modules and respective die of the column based on respective pitch lengths of the conductive modules and the die of the column.

5. The design of claim 4, and further comprising an upper platform to support said conductive modules wherein the upper platform has sprocket holes to facilitate alignment of said each conductive module to said respective die.

6. The design of claim 5, and further comprising a lower platform to support said column of die, said lower platform having a pin used to move a die from the lower platform to the upper platform.

7. The design of claim 4, further comprising a curable adhesive on each conductive module to structurally attach said each conductive module to said respective die.

8. The design of claim 4, further comprising ultrasonic bonding means to structurally attach said each conductive module to said respective die.

9. The design of claim 7, wherein the curable adhesive is a photosensitive curable adhesive.

10. A design for attaching a plurality of die to a plurality of conductive modules comprising:
    a column of die having been sawed from a wafer wherein each die contains one or more solder pads;
    a plurality of conductive modules wherein said plurality of conductive modules are aligned over said column of die so that each of said plurality of conductive modules can be attached to a respective die; and
    circuitry to electrically connect said each of said plurality of conductive modules to said respective die using said one or more solder pads,
    wherein the solder pads are bumped and pressure applied during connection is such that a space is provided between said each conductive module and said respective die for high frequency conductance.

11. The design of claim 4, wherein said each conductive module comprises symmetrical conductive members.

12. A method of attaching multiple conductive modules to respective die wherein a plurality of die attachments can be performed near simultaneously, the method comprising the steps of:
    providing a column of die sawed from a wafer and having solderable pads;
    aligning the multiple conductive modules over the column of die;
    attaching the multiple conductive modules to respective multiple die, wherein the multiple die in the column have a fixed pitch.

13. The method according to claim 12, further comprising the steps of:
    removing attached multiple conductive modules to respective die;
    aligning a second set of multiple conductive modules over the column of die to a second set of respective die;

attaching the second set of multiple conductive modules to the second set of respective die so that die are attached more efficiently than if aligned and attached one at a time.

14. The method according to claim 12 wherein said aligning step is performed visually.

15. A method of attaching multiple conductive modules to respective die wherein a plurality of die attachments can be performed near simultaneously, the method comprising:
   providing a column of die sawed from a wafer and having solderable pads;
   aligning the multiple conductive modules over the column of die; and
   attaching the multiple conductive modules to respective die in succession;
   wherein said aligning step is performed mechanically using sprocket holes.

16. A method of attaching multiple conductive modules to respective die wherein a plurality of die attachments can be performed near simultaneously, the method comprising the steps of:
   providing a column of die sawed from a wafer and having solderable pads;
   aligning the multiple conductive modules over the column of die; and
   attaching the multiple conductive modules to respective die in succession;
   wherein said attaching step further comprises the steps of;
   bonding electrical connections between the die and the conductive modules using a laser; and
   securing the die attachments structurally using a photo-sensitive hardening material and exposing said photo-sensitive material to UV light.

17. The design of claim 10, further comprising a curable adhesive on each conductive module, through which the one or more solder pads penetrate during the connection, to structurally attach said each conductive module to said respective die.

18. The method according to claim 15, wherein said attaching further comprises:
   bonding electrical connections between the die and the conductive modules using a laser; and
   securing the die attachments structurally using a photo-sensitive hardening material and exposing said photo-sensitive material to UV light.

19. The method according to claim 16, wherein said aligning step is performed mechanically using sprocket holes.

* * * * *